(12) United States Patent
Ha et al.

(10) Patent No.: US 9,099,674 B2
(45) Date of Patent: Aug. 4, 2015

(54) ORGANIC LIGHT-EMITTING DISPLAY DEVICE

(75) Inventors: Jae-Heung Ha, Yongin (KR);
Kyu-Hwan Hwang, Yongin (KR);
Seok-Gyu Yoon, Yongin (KR);
Young-Woo Song, Yongin (KR);
Jong-Hyuk Lee, Yongin (KR); Jun-Ho Choi, Yongin (KR); Jin-Koo Chung, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/026,714

(22) Filed: Feb. 14, 2011

(65) Prior Publication Data
US 2011/0204369 A1     Aug. 25, 2011

(30) Foreign Application Priority Data

Feb. 19, 2010    (KR) .................. 10-2010-0015241

(51) Int. Cl.
H01L 51/52       (2006.01)
(52) U.S. Cl.
CPC ........ H01L 51/5234 (2013.01); H01L 51/5228 (2013.01); *H01L 2251/5315* (2013.01); *H01L 2251/5323* (2013.01)
(58) Field of Classification Search
CPC .............. H01L 51/52; H01L 51/5228; H01L 2251/5323
USPC .......... 257/40, 59, E51.019, E51.02, E51.022
See application file for complete search history.

(56) References Cited

U.S. PATENT DOCUMENTS 6,917,160 B2    7/2005    Koo et al.
7,282,855 B2   10/2007    Park et al.
(Continued)

FOREIGN PATENT DOCUMENTS

JP    2001-230086    8/2001
JP    2002-318556   10/2002
(Continued)

OTHER PUBLICATIONS

English translation of Fujioka, WO 2007148540, 2007.*
(Continued)

*Primary Examiner* — Minchul Yang
(74) *Attorney, Agent, or Firm* — Robert E. Bushnell, Esq.

(57) ABSTRACT

An organic light-emitting display device which is transparent by improving a transmittance in transmitting regions and which reduces a voltage drop in an opposite electrode comprises: a substrate having a transmitting region and pixel regions separated from each other by the transmitting region; thin film transistors positioned on the substrate and disposed in the pixel regions, respectively; a passivation layer covering the thin film transistors, formed in the transmitting region and the pixel regions, and having a first opening formed in a location corresponding to at least a portion of the transmitting region; pixel electrodes formed on the passivation layer so as to be electrically connected to the thin film transistors, respectively, located in the pixel regions, and disposed so as to overlap and cover the thin film transistors, respectively; an opposite electrode facing the pixel electrodes, formed so as to be able to transmit light, and located in the transmitting region and the pixel regions; an organic emission layer interposed between the pixel electrodes and the opposite electrode so as to emit light; and a conduction unit formed of a conductive material, disposed so as to overlap with the first opening, and contacting the opposite electrode.

26 Claims, 13 Drawing Sheets

(56) References Cited

U.S. PATENT DOCUMENTS

| | | |
|---|---|---|
| 7,582,501 B2 | 9/2009 | Lee et al. |
| 7,658,803 B2 | 2/2010 | Park |
| 7,740,515 B2 | 6/2010 | Park et al. |
| 2002/0011783 A1 | 1/2002 | Hosokawa |
| 2002/0158835 A1 | 10/2002 | Kobayashi et al. |
| 2003/0052869 A1 | 3/2003 | Fujii et al. |
| 2005/0029926 A1 | 2/2005 | Park et al. |
| 2005/0029936 A1 | 2/2005 | Kim |
| 2005/0099369 A1 | 5/2005 | Lee |
| 2005/0110422 A1 | 5/2005 | Kim et al. |
| 2005/0269945 A1 | 12/2005 | Su |
| 2005/0275339 A1 | 12/2005 | Seo et al. |
| 2007/0046186 A1 | 3/2007 | Kim |
| 2007/0080350 A1 | 4/2007 | Chin et al. |
| 2007/0090757 A1 | 4/2007 | Kim et al. |
| 2007/0092981 A1 | 4/2007 | Jung et al. |
| 2007/0176169 A1 | 8/2007 | Lee et al. |
| 2008/0020500 A1 | 1/2008 | Park et al. |
| 2008/0218062 A1 | 9/2008 | Kim |
| 2008/0230775 A1 | 9/2008 | Rhee et al. |
| 2008/0258617 A1 | 10/2008 | Kobayashi |
| 2009/0200544 A1 | 8/2009 | Lee et al. |
| 2009/0261712 A1 | 10/2009 | Choi et al. |
| 2009/0280590 A1 | 11/2009 | Seo et al. |
| 2009/0302751 A1* | 12/2009 | Hanawa ................. 313/504 |
| 2010/0012928 A1 | 1/2010 | Lee et al. |
| 2010/0052517 A1 | 3/2010 | Kim |
| 2010/0059754 A1 | 3/2010 | Lee et al. |

FOREIGN PATENT DOCUMENTS

| | | |
|---|---|---|
| JP | 2003-059660 | 2/2003 |
| JP | 2007311358 A | 11/2007 |
| JP | 2008282049 A | 11/2008 |
| JP | 2010026350 A | 2/2010 |
| KR | 1020040074658 | 8/2004 |
| KR | 1020050015365 | 2/2005 |
| KR | 10-0544138 B1 | 1/2006 |
| KR | 1020070042291 | 4/2007 |
| KR | 10-2007-0078599 A | 8/2007 |
| KR | 1020080086025 | 9/2008 |
| KR | 10-2009-0016238 A | 2/2009 |
| WO | 2007148540 A1 | 12/2007 |

OTHER PUBLICATIONS

Korean Notice of Allowance issued on Oct. 31, 2011 in connection with Korean Patent Application Serial No. 10-2010-0015241 and Request for Entry of the Accompanying Office Action attached herewith.

Japanese Office Action issued on Feb. 25, 2014 in connection with Japanese Patent Application No. 2010-228947 which corresponds to the present application and Request for Entry of the Accompanying Office Action attached herewith.

* cited by examiner

ORGANIC LIGHT-EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on the 19 Feb. 2010 and there duly assigned Serial No. 10-2010-00015241.

BACKGROUND OF THE INVENTION

1. Field of the Invention

The present invention relates to an organic light-emitting display device and, more particularly, to a transparent organic light-emitting display device.

2. Description of the Related Art

Applications of organic light-emitting display devices range from personal portable devices, such as MP3 players and mobile phones, to television sets due to their having superior characteristics such as wide viewing angles, high contrast ratios, short response times, and low amounts of power consumption.

An organic light-emitting display device has self-light emitting characteristics, and the weight and thickness of the organic light-emitting display device can be reduced since the organic light-emitting display device, unlike the liquid crystal display device, does not require an additional light source.

Also, the organic light-emitting display device can be formed as a transparent display device by including transparent thin film transistors and transparent organic light-emitting devices.

In such a transparent display device, when the transparent display device is in an off-state, an object or an image positioned on a side of the device, which is opposite to the user, is transmitted to the user not only through organic light-emitting diodes but also through patterns of thin film transistors and various wires, as well as through spaces between the patterns of thin film transistors and various wires. However, the transmittances of the organic light-emitting diodes, the thin film transistors and the wires are not so high, and spaces between the organic light-emitting diodes, the thin film transistor and the wires are very small, and thus the transmittance of the transparent display device is not high.

Also, a distorted image may be transmitted to the user due to the patterns of the organic light-emitting diodes, the thin film transistors and the wires. The reason for this is because gaps between the patterns are only a few nanometers, that is, at a distance almost close to the wavelengths of visible light, and thus the gaps scatter light therethrough.

Furthermore, when an opposite electrode to be commonly deposited on the entire screen is formed with a small thickness in order to improve the transmittance of external light, a voltage drop, i.e., an IR drop, may occur in the opposite electrode, and in particular, as the size of the organic light-emitting display device increases, the voltage drop may increase remarkably.

SUMMARY OF THE INVENTION

The present invention relates to an organic light-emitting display device which can be transparent by improving a transmittance in transmitting regions, and which can reduce a voltage drop in an opposite electrode.

The present invention also relates to a transparent organic light-emitting display device which can prevent distortion of an image transmitted therethrough by preventing light transmitting therethrough from scattering.

According to an aspect of the present invention, an organic light-emitting display device includes: a substrate having a transmitting region and a plurality of pixel regions separated from each other by the transmitting region interposed between the pixel regions; a plurality of thin film transistors positioned on a first surface of the substrate and disposed in the pixel regions of the substrate, respectively; a passivation layer covering the plurality of thin film transistors, formed in the transmitting region and the pixel regions, and having a first opening formed in a location corresponding to at least a portion of the transmitting region; a plurality of pixel electrodes formed on the passivation layer so as to be electrically connected to the thin film transistors, respectively, the pixel electrodes being located in the pixel regions and being disposed so as to overlap and cover the thin film transistors, respectively; an opposite electrode which faces the pixel electrodes, which is formed so as to be able to transmit light, and which is located in the transmitting region and the pixel regions; an organic emission layer interposed between the pixel electrodes and the opposite electrode so as to emit light; and a conduction unit, including a conductive material, disposed so as to overlap with the first opening, and contacting the opposite electrode.

The pixel electrodes each may have an area identical to that of one of the pixel regions.

The organic light-emitting display device may further include a plurality of conductive lines electrically connected to the thin film transistors, respectively, wherein at least one of the conductive lines is arranged to overlap each of the pixel electrodes.

A ratio of a total area of the transmitting region with respect to a total area of the pixel regions and the transmitting region may be between 5% and 90%.

The passivation layer may include a transparent material.

The conduction unit may be interposed between the substrate and the opposite electrode.

The conduction unit may be formed on the opposite electrode.

A plurality of insulating layers may be formed in a location corresponding to the transmitting region.

At least one of the insulating layers may have a second opening connected to the first opening at a location corresponding to at least a portion of the transmitting region.

The pixel electrode may be a reflective electrode.

The conduction unit may be reversely tapered.

The conduction unit may have a plurality of holes.

According to another aspect of the present invention, an organic light-emitting display device includes: a substrate having a transmitting region and a plurality of pixel regions separated from each other by the transmitting region interposed between the pixel regions; a plurality of pixel circuit units formed on a first surface of the substrate, each including at least one thin film transistor and positioned in a respective one of the pixel regions; a first insulating layer covering the pixel circuit units, formed in the transmitting region and the pixel regions, and having a third opening formed in a location corresponding to at least a portion of the transmitting region; a plurality of pixel electrodes formed on the first insulating layer so as to be electrically connected to the pixel circuit units, respectively, and disposed so as to overlap and cover the pixel circuit units, respectively; an opposite electrode which faces the pixel electrodes, is formed so as to be able to transmit light, and is located in the transmitting region and the pixel regions; an organic emission layer interposed between the pixel electrodes and the opposite electrode so as to emit light; and a conduction unit, including a conductive material, disposed so as to overlap with the third opening and contacting the opposite electrode.

The pixel electrodes may be formed in the pixel regions, respectively.

The organic light-emitting display device may further include a plurality of conductive lines electrically connected to the pixel circuit units, respectively, wherein at least one of the conductive lines is arranged to cross each of the pixel regions.

A ratio of a total area of the transmitting region with respect to a total area of the pixel regions and the transmitting region may be between 5% and 90%.

The first insulating layer may include a transparent material.

The conduction unit may be interposed between the substrate and the opposite electrode.

The conduction unit may be formed on the opposite electrode.

A plurality of second insulating layers, including a transparent material, may be further formed in the transmitting region and the pixel regions.

At least one of the second insulating layers may have a fourth opening connected to the third opening and formed in a location corresponding to at least a portion of the transmitting region.

The pixel electrode may be a reflective electrode.

The conduction unit may be reversely tapered.

The conduction unit may have a plurality of holes.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings in which exemplary embodiments of the invention are shown.

Figure 1:
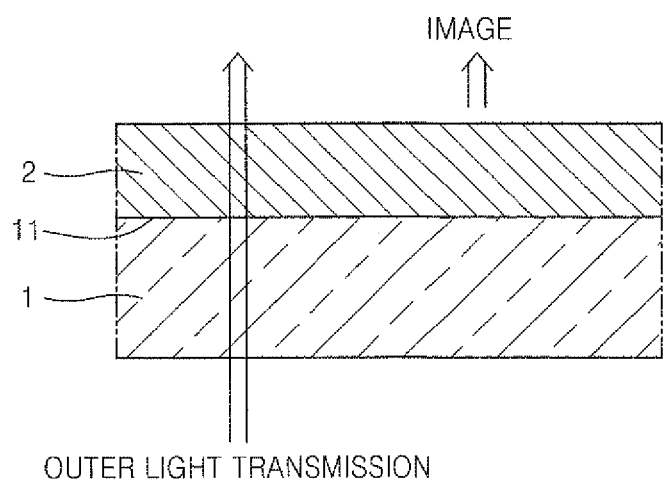
FIG. 1 is a cross-sectional view of an organic light-emitting display device according to an embodiment of the present invention.

FIG. 1 is a cross-sectional view of an organic light-emitting display device according to an embodiment of the present invention.

Referring to FIG. 1, the organic light-emitting display device according to the current embodiment of the present invention includes a display unit 2 formed on a first surface 11 of a substrate 1.

In the organic light-emitting display device, external light enters through the substrate 1 and the display unit 2.

As will be described later, the display unit 2 is formed so as to be able to transmit external light. That is, referring to FIG. 1, the display unit 2 is formed in such a way that a user positioned on a side where an image is displayed can observe an object outside the substrate 1.

Figure 2:
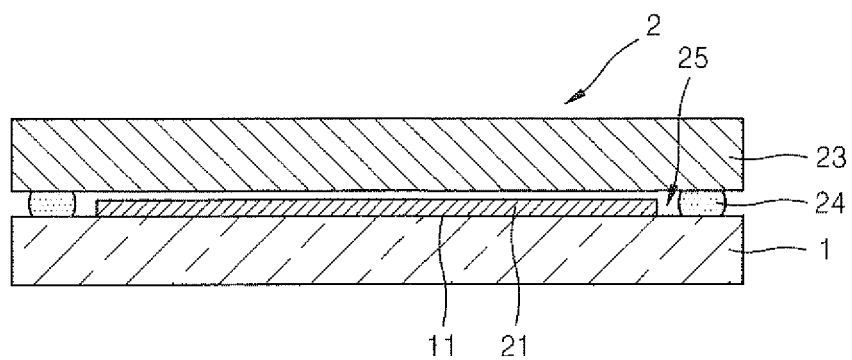
FIG. 2 is a cross-sectional view of the organic light-emitting display device of FIG. 1 in detail according to an embodiment of the present invention.

FIG. 2 is a cross-sectional view of the organic light-emitting display device of FIG. 1 in detail according to an embodiment of the present invention. The display unit 2 is assembled together with an organic emission unit 21 formed on the first surface 11 of the substrate 1 and a sealing substrate 23 for sealing the organic emission unit 21.

The sealing substrate 23 may be formed of a transparent material which allows viewing of an image generated by the organic emission unit 21, and which prevents external air and moisture from penetrating into the organic emission unit 21.

Edge portions of the substrate 1 and the sealing substrate 23 are sealed by a sealant 24, and thus a space 25 is formed between the substrate 1 and the sealing substrate 23. The space 25 may be filled with an absorbent or a filler, as described below.

Figure 3:
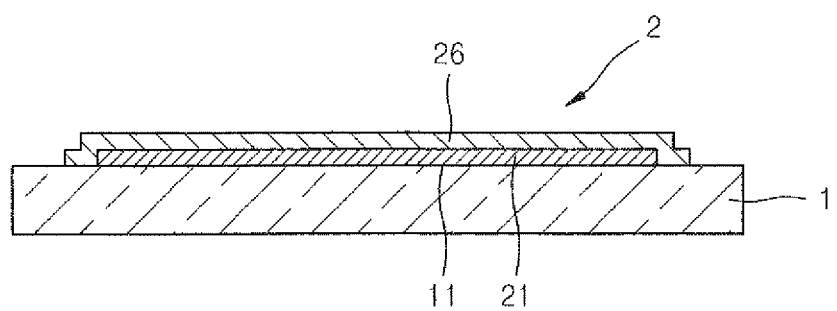
FIG. 3 is a cross-sectional view of the organic light-emitting display device of FIG. 1 in detail according to another embodiment of the present invention.

FIG. 3 is a cross-sectional view of the organic light-emitting display device of FIG. 1 in detail according to another embodiment of the present invention. As shown in FIG. 3, a thin sealing film 26 may be formed on the organic emission unit 21 to protect the organic emission unit 21 from external air. The thin sealing film 26 may have a structure in which films, each formed of an inorganic material such as silicon oxide or silicon nitride, and films, each formed of an organic material such as epoxy or polyimide, are alternately stacked, but it is not limited thereto, and the thin sealing film 26 may have any thin film type sealing structure.

Figure 4:
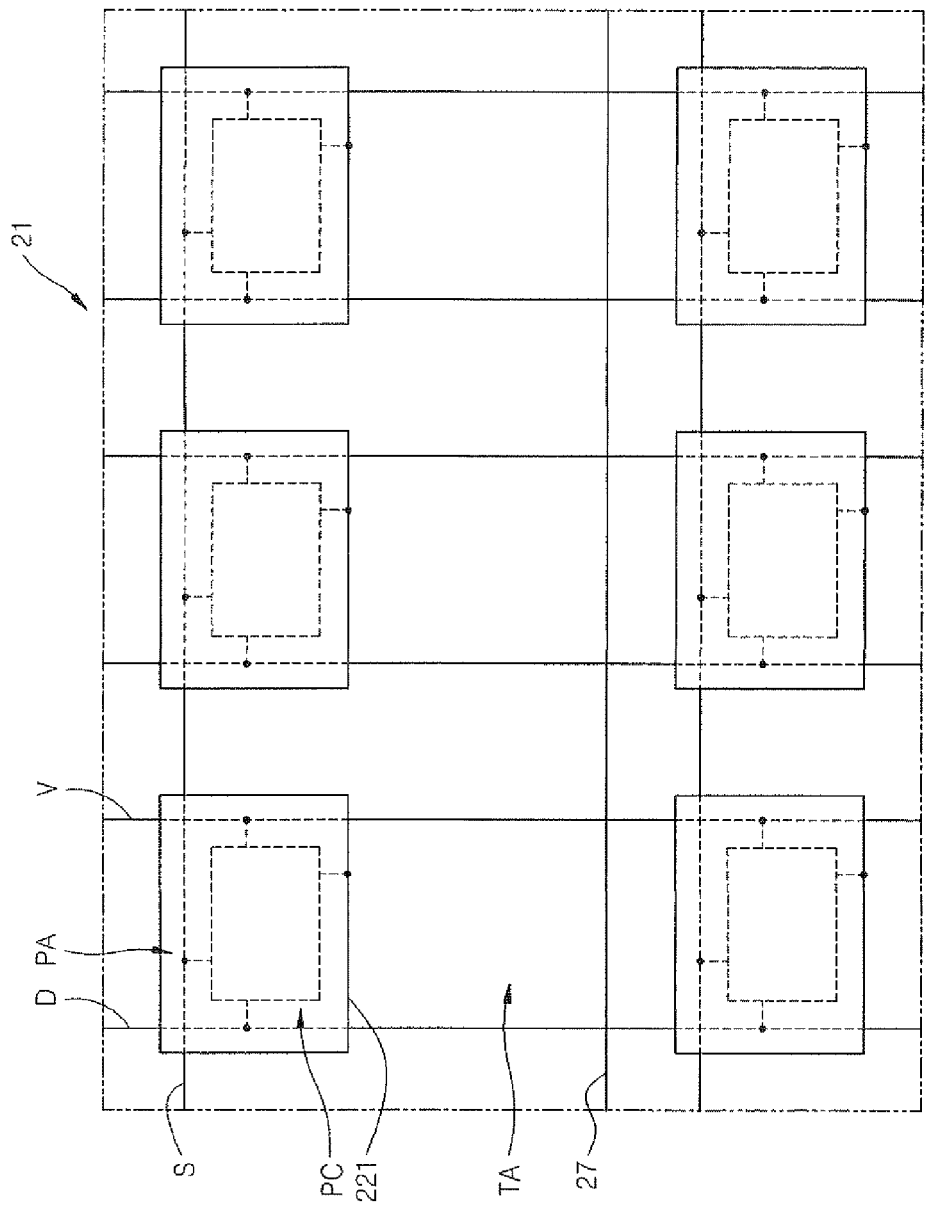
FIG. 4 is a schematic drawing of the organic emission unit of FIG. 2 or FIG. 3 according to an embodiment of the present invention.
Figure 5:
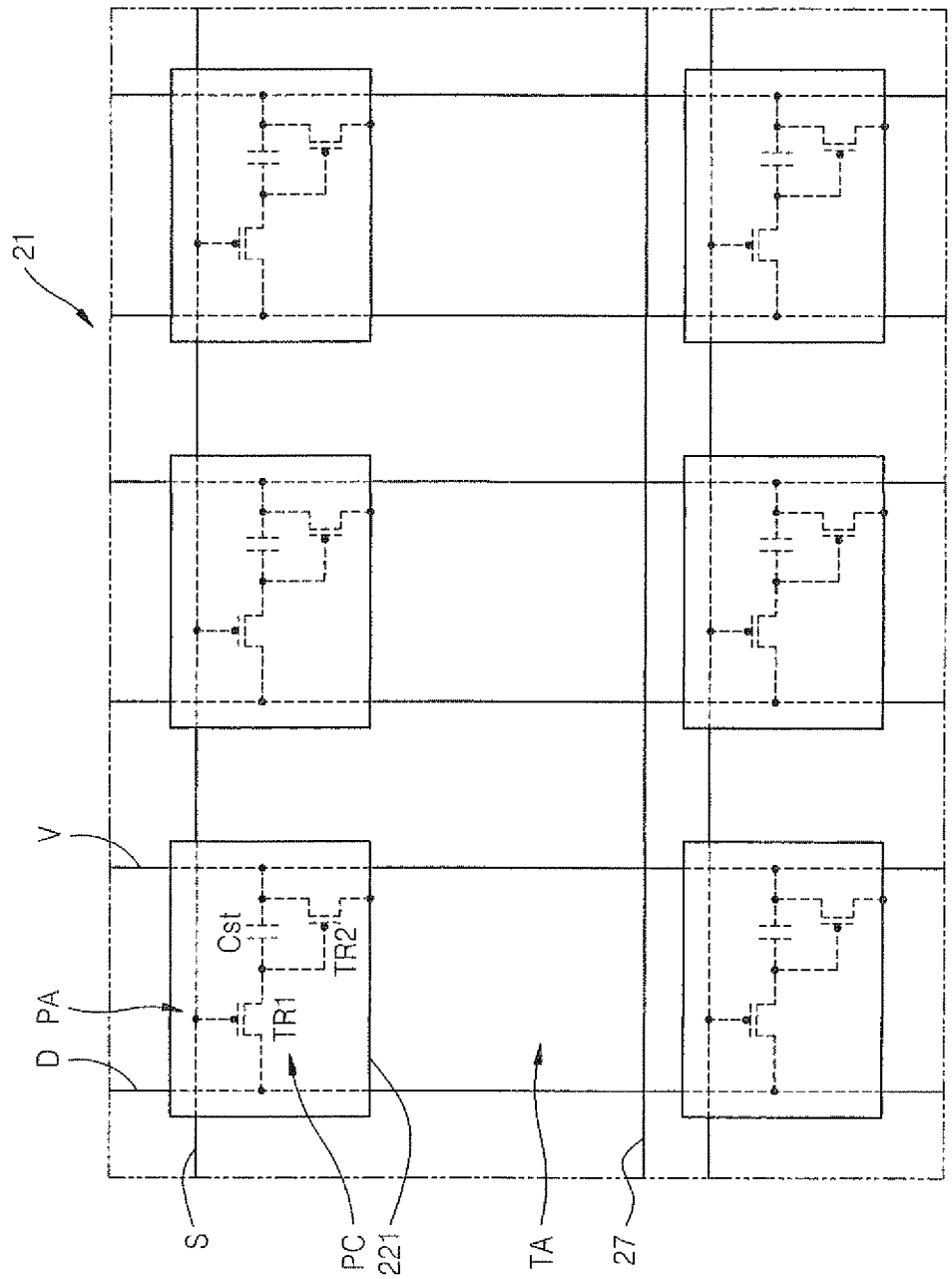
FIG. 5 is a schematic drawing of a pixel circuit unit of the organic emission unit of FIG. 4 in detail according to an embodiment of the present invention.

FIG. 4 is a schematic drawing of the organic emission unit of FIG. 2 or FIG. 3 according to an embodiment of the present invention, and FIG. 5 is a schematic drawing of a pixel circuit unit of the organic emission unit of FIG. 4 in detail according to an embodiment of the present invention.

Referring to FIGS. 2 thru 5, the organic emission unit 21 of the present embodiment is formed on the substrate 1 on which transmitting regions TA for transmitting external light, and a plurality of pixel regions PA separated from each other and having the transmitting regions TA interposed therebetween, are defined.

Each of the pixel regions PA includes the pixel circuit unit PC and a plurality of conductive lines, such as a scan line S, a data line D and a driving power line V, which are electrically connected to the pixel circuit unit PC, as shown in FIG. 4. Although not shown, various other conductive lines, in addition to the scan line S, the data line D and the driving power line V, may further be connected to the pixel circuit unit PC according to the configuration of the pixel circuit unit PC.

As shown in FIG. 5, the pixel circuit unit PC includes a first thin film transistor (TFT) TR1 connected to the scan line S and the data line D, a second TFT TR2 connected to the first TFT TR1 and the driving power line V, and a capacitor Cst connected to the first TFT TR1 and the second TFT TR2. The first TFT TR1 is a switching transistor and the second TFT TR2 is a driving transistor. The second TFT TR2 is electrically connected to a pixel electrode 221. In FIG. 5, both the first TFT TR1 and the second TFT TR2 are P-type transistors, but they are not limited thereto, and at least one of the first TFT TR1 and the second TFT TR2 may be an N-type transistor. The number of thin film transistors and the number of capacitors are not limited to the number shown in FIGS. 4 and 5, and, for example, two or more thin film transistors and one or more capacitors may be combined with each other depending on the pixel circuit unit PC.

According to the current embodiment of the present invention, at least one of the conductive lines, including the scan line S, the data line D and the driving power line V, may be disposed so as to cross the pixel region PA. For example, all of the conductive lines, including the scan line S, the data line D and the driving power line V, may be disposed so as to cross the pixel region PA.

The pixel regions PA are light-emitting regions. Since the pixel circuit unit PC is located in a light-emitting region and all of the conductive lines, including the scan line S, the data line D and the driving power line V, cross the light-emitting region, the user can see an outside view through the organic light-emitting display device through the transmitting regions TA. As will be described later, since a portion of each of the scan line S, the data line D and the driving power line V crosses the transmitting regions TA, the area of a conductive pattern is minimized since the conductive pattern is one of the main factors lowering the transmittance of the transmitting organic light-emitting display device, and thus, with the structure shown in FIGS. 4 and 5, the transmittance of the transmitting regions TA is further increased. In this way, a region where the image is displayed is divided into the pixel regions PA and the transmitting regions TA, and most portions of the conductive patterns, which is one of the main factors lowering the overall transmittance of the transparent organic light-emitting display device, are disposed in the pixel regions PA to increase the transmittance of the transmitting regions TA, so that the transmittance of the region where the image is displayed in the organic light-emitting display device can be improved as compared to the transmittance of a conventional transparent display device.

In addition, external image distortion occurs due to scattering of external light which is caused by interfering with the patterns of internal devices of the pixel circuit unit PC when the user observes the outside view through the organic light-emitting display device through the transmitting regions TA according to the region where the image is displayed, which is divided into the pixel regions PA and the transmitting regions TA, as described above.

Although the conductive lines, including the scan line S, the data line D and the driving power line V, are disposed between the pixel regions PA so as to cross the transmitting regions TA, since the conductive lines are formed very thin, the conductive lines can hardly be seen by the user and have little effect on the overall transmittance of the organic emission unit 21. Accordingly, a transparent display can be realized. Also, although the user may not see the external image as much in regions covered by the pixel regions PA, in consideration of the overall display region, there is little effect on observing the external image since the pixel regions PA are like a plurality of dots regularly arranged on a surface of a transparent glass.

The transmitting regions TA and the pixel regions PA are formed in such a way that a ratio of the area of the transmitting regions TA with respect to the overall area of the transmitting regions TA and the pixel regions PA is between 5% and 90%.

If, in the organic light-emitting display device, the ratio of the area of the transmitting regions TA with respect to the overall area of the transmitting regions TA and the pixel regions PA is less than 5%, with respect to FIG. 1, the user can hardly see an object or image on a side opposite to the user due to lack of light that can transmit through the display unit 2 when the display 2 unit is in an off-state. That is, the display unit 2 is not a transparent device. Although the ratio of the area of the transmitting regions TA with respect to the overall area of the transmitting regions TA and the pixel regions PA may be approximately 5%, the pixel regions PA are present in an island state with respect to the transmitting regions TA, and the scattering of light is minimized since all conductive patterns are disposed across the pixel regions PA, and thus the display unit 2 may be seen by the user as being a transparent display unit. As will be described later, when a transistor included in the pixel circuit unit PC is formed of a transparent thin film transistor (TFT), such as an oxide semiconductor, and an organic light-emitting device is a transparent device, the display unit 2 may further be seen by the user as being a transparent display unit.

If the ratio of the area of the transmitting regions TA with respect to the entire area of the pixel regions PA and the transmitting regions TA is greater than 90%, the pixel integrity of the display unit 2 is excessively reduced, and thus, a stable image can hardly be realized through the light emission from the pixel regions PA. That is, as the area of the pixel regions PA is reduced, the amount of light emitted from an organic emission layer 223 (see FIG. 7) must be increased in order to realize an image. However, if the organic light-emitting display device of FIG. 1 is operated to emit light having a high brightness, the lifetime of the organic light-emitting display device of FIG. 1 is rapidly reduced. Also, when the ratio of the area of the transmitting regions TA with respect to the entire are of the pixel regions PA and the transmitting regions TA is greater than 90% and the size of a single pixel region PA is maintained at an appropriate size, the number of pixel regions PA is reduced, and accordingly, the resolution of the organic light-emitting display device of FIG. 1 is reduced.

The ratio of the area of the transmitting regions TA with respect to the entire area of the pixel regions PA and the transmitting regions TA may further be in a range of 20% to 70%.

When the ratio of the area of the transmitting regions TA with respect to the entire area of the pixel regions PA and the transmitting regions TA is less than 20%, the ratio of the area of the pixel regions PA with respect to the area of the transmitting regions TA is excessively large. Therefore, the user has a limit in observing an external image through the transmitting regions TA. When the ratio of the area of the transmitting regions TA with respect to the entire area of the pixel regions PA and the transmitting regions TA exceeds 70%, there are a lot of limitations in designing the pixel circuit unit PC.

Each of the pixel regions PA includes the pixel electrode 221 that has an area corresponding to the area of pixel regions PA and is electrically connected to the pixel circuit unit PC. The pixel circuit unit PC overlaps with the pixel electrode 221 so that the pixel electrode 221 covers the pixel circuit unit PC. Also, the conductive lines, including the scan line S, the data line D and the driving power line V, are disposed crossing the pixel electrode 221. According to another embodiment of the present invention, the pixel electrode 221 may have an area equal to or slightly greater than that of the pixel region PA.

Figure 6:
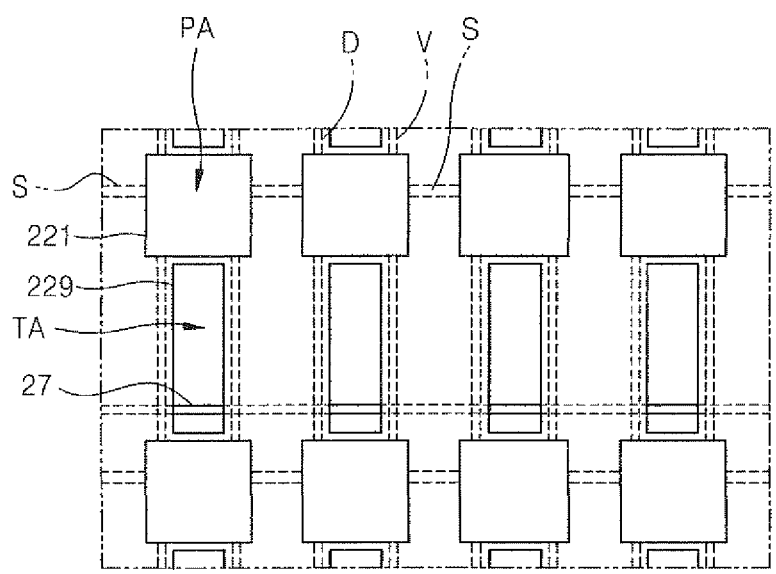
FIG. 6 is a plan view specifically showing an example of the organic emission unit of FIG. 5.

FIG. 6 is a plan view specifically showing an example of the organic emission unit of FIG. 5. As shown in FIG. 6, when the user observes the organic emission unit 21, the pixel circuit unit PC described above is covered by the pixel electrode 221 and a large portion of the conductive lines are also covered. Therefore, since the user sees only a portion of the conductive lines in the transmitting regions TA, the overall transmittance of the transparent organic light-emitting display device is improved as described above, and thus the user can see an external image or object through the transmitting regions TA.

In order to further increase the transmittance of external light in the transmitting regions TA, an opening 229 (see FIG. 7) is formed in insulating layers at a location corresponding to at least a portion of the transmitting regions TA. A conduction unit 27 is further formed in the transmitting regions TA, as will be described later.

Figure 7:
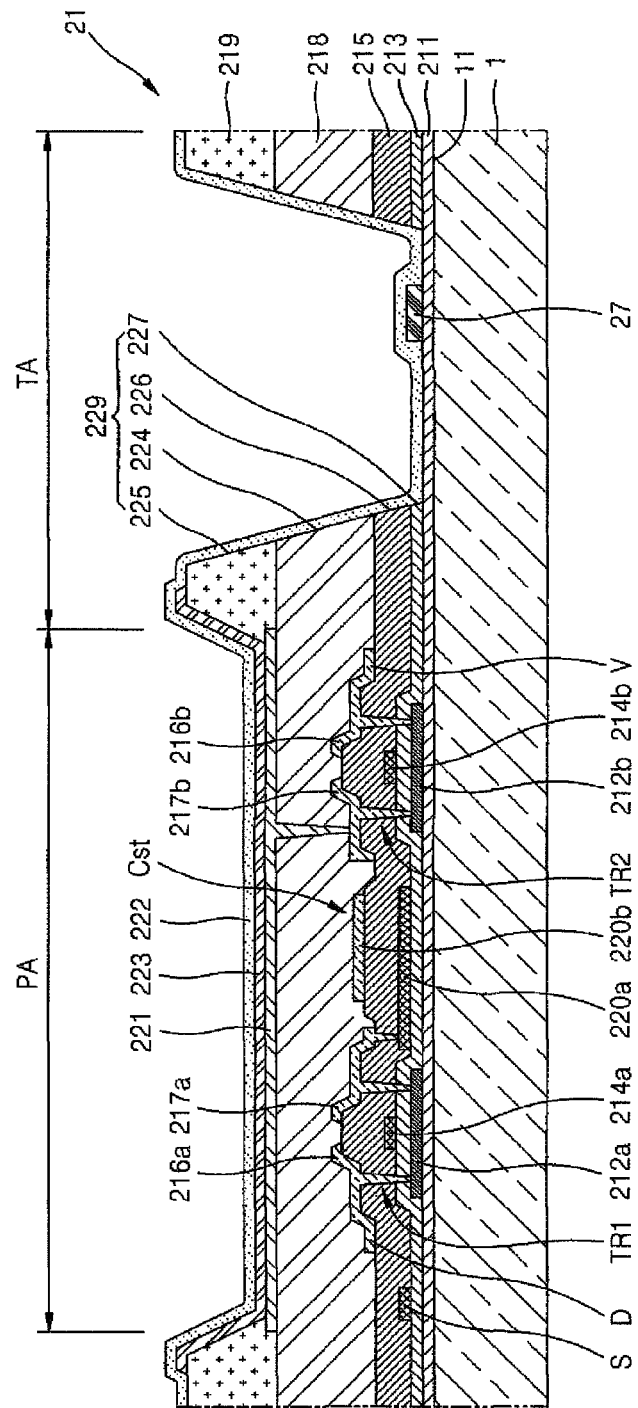
FIG. 7 is a cross-sectional view of the organic emission unit including the pixel circuit unit of FIG. 5 in detail according to an embodiment of the present invention.

FIG. 7 is a cross-sectional view of the organic emission unit including the pixel circuit unit of FIG. 5 in detail according to an embodiment of the present invention.

According to the present embodiment of the invention, in the organic emission unit 21 of FIG. 7, a buffer layer 211 is formed on the first surface 11 of the substrate 1, and the first TFT TR1, the capacitor Cst, and the second TFT TR2 are formed on the buffer layer 211.

First, a first semiconductor active layer 212a and a second semiconductor active layer 212b are formed on the buffer layer 211.

The buffer layer 211 prevents impurities from penetrating into the organic emission unit 21 and planarizes the first surface 11 of the substrate 1. The buffer layer 211 may be formed of any of various materials that can perform the functions described above. For example, the buffer layer 211 may be formed of an inorganic material such as silicon oxide, silicon nitride, silicon oxynitride, aluminum oxide, aluminum nitride, titanium oxide, or titanium nitride, an organic material such as polyimide, polyester, or acryl, or any possible combinations of these materials. The buffer layer 211 is not an essential element, and may not be formed.

The first and second semiconductor active layers 212a and 212b, respectively, may be formed of polycrystal silicon, but are not limited thereto, and may be formed of an oxide semiconductor. For example, the first and second semiconductor active layers 212a and 212b, respectively, may be G-I—Z—O layers [$(In_2O_3)_a(Ga_2O_3)_b(ZnO)_c$ layer] (where a, b, and c are integers that respectively satisfy a≥0, b≥0, and c>0). When the first and second semiconductor active layers 212a and 212b, respectively, are formed of an oxide semiconductor, optical transmittance can further be increased, compared to when the layers 212a and 212b are formed of polycrystal silicon.

A gate insulating layer 213 is formed on the buffer layer 211 to cover the first and second semiconductor active layers 212a and 212b, respectively, and first and second gate electrodes 214a and 214b, respectively, are formed on the gate insulating layer 213.

An interlayer insulating layer 215 is formed on the gate insulating layer 213 to cover the first and second gate electrodes 214a and 214b, respectively. A first source electrode 216a and a first drain electrode 217a and a second source electrode 216b and a second drain electrode 217b are each formed on the interlayer insulating layer 215, and are respectively connected to the first semiconductor active layer 212a and the second semiconductor active layer 212b through contact holes.

In FIG. 7, the scan line S may be simultaneously formed with the first and second gate electrodes 214a and 214b, respectively. The data line D may be simultaneously formed with the first source electrode 216a and connected to the first source electrode 216a. The driving power line V may be simultaneously formed with the second source electrode 216b and connected to the second source electrode 216b.

For the capacitor Cst, a lower electrode 220a is simultaneously formed with the first and second gate electrodes 214a and 214b, respectively, and an upper electrode 220b is simultaneously formed with the first drain electrode 217a.

The structures of the first TFT TR1, the capacitor Cst, and the second TFT TR2 are not limited thereto, and any of various types of TFT and capacitor structures can be employed. For example, the first TFT TR1 and the second TFT TR2 have a top gate structure. However, the first TFT TR1 and the second TFT TR2 may have a bottom gate structure in which the first gate electrode 214a and the second gate electrode 214b are disposed on bottom surfaces of the first semiconductor active layer 212a and the second semiconductor active layer 212b, respectively. Of course, various types of TFT structures can be employed.

A passivation layer 218 is formed to cover the first TFT TR1, the capacitor Cst, and the second TFT TR2. The passivation layer 218 may be a single layer or multiple layers of insulating material, upper surfaces of which are planarized. The passivation layer 218 may be formed of an inorganic material and/or an organic material.

One of the pixel electrodes 221 may be formed on the passivation layer 218 so as to cover the first TFT TR1, the capacitor Cst, and the second TFT TR2, as shown in FIG. 7. The pixel electrode 221 is connected to the second drain electrode 217b of the second TFT TR2 through a via hole formed in the passivation layer 218. As shown in FIG. 6, the pixel electrode 221 is formed as an island type electrode comprising islands separated from each other.

A pixel defining layer 219 is formed on the passivation layer 218 so as to cover edge portions of the pixel electrode 221. The organic emission layer 223 and an opposite electrode 222 are sequentially formed on the pixel electrode 221 in the order stated. The opposite electrode 222 is formed on all of the pixel regions PA and the transmitting regions TA.

The organic emission layer 223 may be a low molecular weight organic film or a polymer organic film. When the organic emission layer 223 is a low molecular weight organic film, the organic emission layer 223 may be formed by stacking a hole injection layer (HIL), a hole transport layer (HTL), an emission layer (EML), an electron transport layer (ETL), and an electron injection layer (EIL) in a single structure or a composite structure, and may be formed of any of various materials such as copper phthalocyanine (CuPc), N,N'-Di (naphthalene-1-yl)-N,N'-diphenyl-benzidine (NPB), or tris-8-hydroxyquinoline aluminum (Alq3). The low molecular weight organic film may be formed by vacuum deposition. The HIL, the HTL, the ETL, and the EIL are common layers and may be commonly applied to red, green, and blue pixels. Accordingly, unlike the organic emission layer 223 in FIG. 7, the common layers may be formed to cover the pixel regions PA and the transmitting regions TA, similar to the opposite electrode 222.

The pixel electrode 221 functions as an anode electrode, and the opposite electrode 222 functions as a cathode electrode. Also, the polarities of the pixel electrode 221 and the opposite electrode 222 may be reversed, that is, the pixel electrode 221 may function as a cathode electrode, and the opposite electrode 222 may function as an anode electrode.

The pixel electrode 221 is formed so as to have a size corresponding to the pixel region PA in each pixel. Other than a region covered by the pixel defining layer 219, the pixel electrode 221 has an area identical to or slightly smaller than that of one of the pixel regions PA. The opposite electrode 222 is formed as a common electrode to cover all the pixels of the organic emission unit 21.

According to another embodiment of the present invention, the pixel electrode 221 may be a reflective electrode and the opposite electrode 222 may be a transparent electrode. Accordingly, the organic emission unit 21 is a top emission type in which an image is displayed in a direction toward the opposite electrode 222.

To this end, the pixel electrode 221 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound of these materials, or an oxide having a high work function such as ITO, IZO, ZnO, or $In_2O_3$. The opposite electrode 222 may be formed of a metal having a low work function such as Ag, Mg, Al, Pt, Pd, Au, Ni, Nd, Ir, Cr, Li, or Ca, or an alloy thereof. The opposite electrode 222 may be formed of a thin film so as to have a high transmittance.

When the pixel electrode 221 is a reflective electrode, a pixel circuit unit PC disposed under the pixel electrode 221 is covered by the pixel electrode 221. Therefore, referring to FIG. 7, at upper outer sides of the opposite electrode 222, the user cannot see the first TFT TR1, the capacitor Cst, and the second TFT TR2 disposed under the pixel electrode 221, as well as portions of the scan line S, the data line D, and the driving power line V.

As the pixel electrode 221 is the reflective electrode, light is emitted only toward the user. Thus, the amount of light that can be lost in a direction opposite to the user can be reduced. Also, since the pixel electrode 221 covers various patterns of the pixel circuit unit PC disposed under the pixel electrode 221, as described above, the user can see a clearer external image or object.

However, aspects of the present invention are not limited thereto, for example, the pixel electrode 221 can also be a transparent electrode, and in this case, the pixel electrode 221 is formed of an oxide having a high work function such as ITO, IZO, ZnO, or $In_2O_3$. If the pixel electrode 221 is a transparent electrode, at the upper outer sides of the opposite electrode 222, the user can see the first TFT TR1, the capacitor Cst, and the second TFT TR2 disposed under the pixel electrode 221, as well as portions of the scan line S, the data line D, and the driving power line V. However, although the pixel electrode 221 is a transparent electrode, there is a loss of light since the transmittance of light therethrough cannot be 100%, and the transmittance of external light is further reduced due to the pixel electrode 221 since the conductive patterns are disposed in the region of the pixel electrode 221. Therefore, interference due to the conductive patterns on the external light is reduced as compared when the external light directly enters the conductive patterns, thereby reducing distortion of an external image.

The passivation layer 218, the gate insulating layer 213, the interlayer insulating layer 215, and the pixel defining layer 219 may be formed as transparent insulating layers. The substrate 1 may have a transmittance greater or equal to the total transmittance of the transparent insulating layers.

In the present invention, in order to further increase the optical transmittance of the transmitting regions TA and to prevent optical interference due to the transparent insulating layers in the transmitting regions TA and lowering of color purity and change of color due to optical interference, the opening 229 is formed in at least a portion of the transparent insulating layers at a location corresponding to at least a portion of the transmitting regions TA.

In the present invention, in order to increase the transmittance of external light of the transmitting regions TA, the area of the transmitting regions TA should be increased, or the transmittance of material formed in the transmitting regions TA should be increased. However, when the area of the transmitting regions TA is increased, there are limitations due to a limitation in designing the pixel circuit unit PC, and thus the transmittance of the material formed in the transmitting regions TA should be increased. However, there are limitations in increasing the transmittance of the material due to difficulties in developing the material.

Thus, the opening 229 is formed in at least a portion of the transparent insulating layers at a location corresponding to at least a portion of the transmitting regions TA.

In FIG. 7, a first opening 224 is formed in the passivation layer 218 for covering the pixel circuit unit PC, and a second opening 225 is formed in the pixel defining layer 219 formed on the passivation layer 218. A third opening 226 is formed in the interlayer insulating layer 215, and a fourth opening 227 is formed in the gate insulating layer 213. The first thru fourth openings 224 thru 227 may be connected to one another to form the opening 229.

After the fourth opening 227 is formed in the gate insulating layer 213, the first gate electrode 214a, the second gate electrode 214b, and the conduction unit 27 may be formed.

By forming each insulating layer by using a mask, the opening 229 may be formed so that an insulating layer may not be formed, or the opening 229 may be formed by removing an insulating layer via a wet etching process or other patterning processes.

The opening 229 may be formed as wide as possible as long as the opening 229 does not interrupt the scan line S and the data line D.

In FIG. 7, the opening 229 is not formed in the buffer layer 211 in order to prevent impurities from penetrating into the substrate 1. Although not shown, if necessary, the opening 229 may be formed even in the buffer layer 211 so that the opening 229 may be connected to the fourth opening 227.

The opening 229 is not limited to the example of FIG. 7 and may be an opening formed in at least one of the insulating layers formed in the transmitting regions TA, i.e., the pixel defining layer 219, the passivation layer 218, the interlayer insulating layer 215, the gate insulating layer 213, and the buffer layer 211.

In this way, the formation of the opening 229 in the transmitting regions TA further increases the optical transmittance of the transmitting regions TA, and thus an external image can be more clearly seen by the user.

As described above, since the opposite electrode 222 is formed of metal in the shape of a thin film so as to increase transmittance, and is formed as a common electrode to cover all of the pixels of the organic emission unit 21, sheet resistance is increased, and a voltage drop easily occurs.

In order to solve these problems, the organic light-emitting display device further includes a conduction unit 27 which is disposed adjacent to the opposite electrode 222.

The conduction unit 27 may be formed of metal having high electrical conductivity, and may be disposed to correspond to the transmitting regions TA, as shown in FIG. 7. The conduction unit 27 overlaps with the opening 229 so as to contact the opposite electrode 222 in the opening 229.

The conduction unit 27 may be formed on the buffer layer 211, may be exposed through the opening 229, and then may contact the opposite electrode 222 when the opposite electrode 222 covers the conduction unit 27 in the opening 229.

Figure 8:
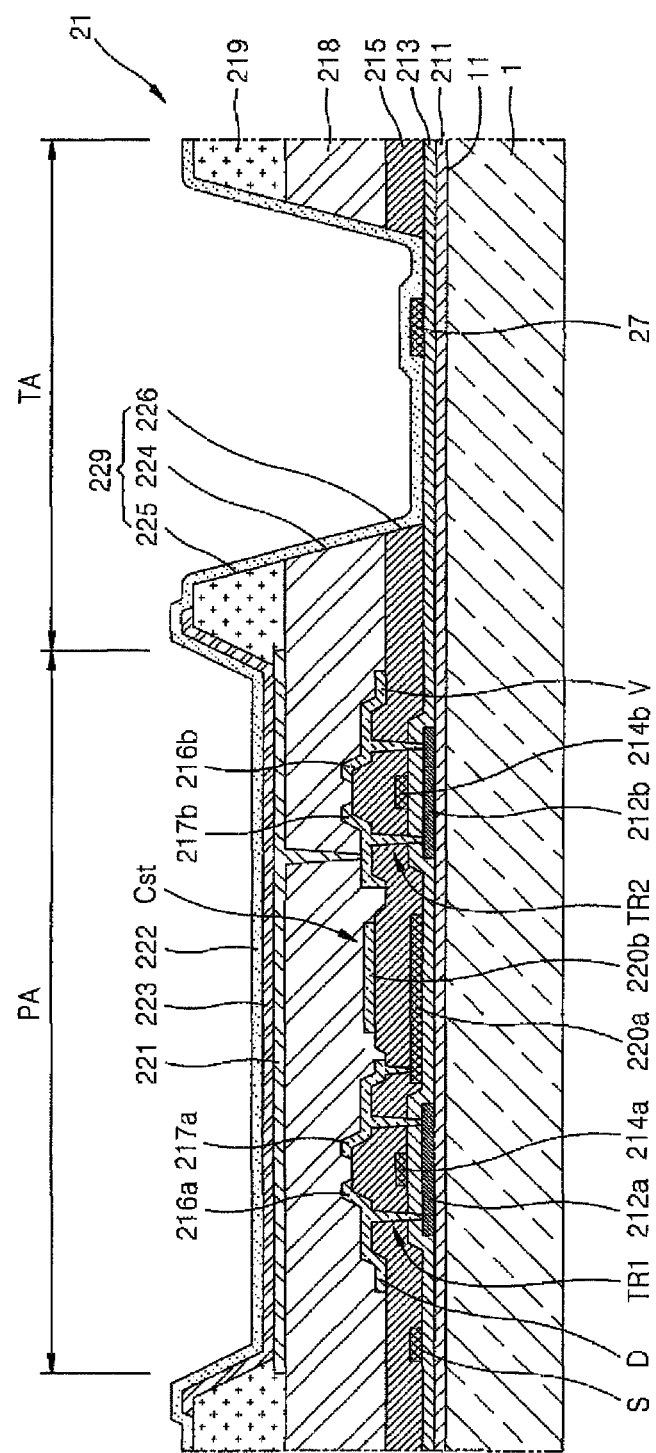
FIG. 8 is a cross-sectional view of the organic emission unit in detail according to another embodiment of the present invention.

FIG. 8 is a cross-sectional view of the organic emission unit in detail according to another embodiment of the present invention.

Referring to FIG. 8, the conduction unit 27 may be formed of the same material as the material for forming the first gate electrode 214a and the second gate electrode 214b, and may be simultaneously formed with the first gate electrode 214a and the second gate electrode 214b. To this end, the conduction unit 27 may be formed on the gate insulating layer 213, and the opening 229 may be formed down to the interlayer insulating layer 215. However, aspects of the present invention are not limited thereto.

When the conduction unit 27 is formed of the same material as the material for forming the first gate electrode 214a and the second gate electrode 214b and is simultaneously formed therewith, the conduction unit 27 may be formed in a straight line parallel to the scan line S, as illustrated in FIGS. 5 and 6.

Figure 9:
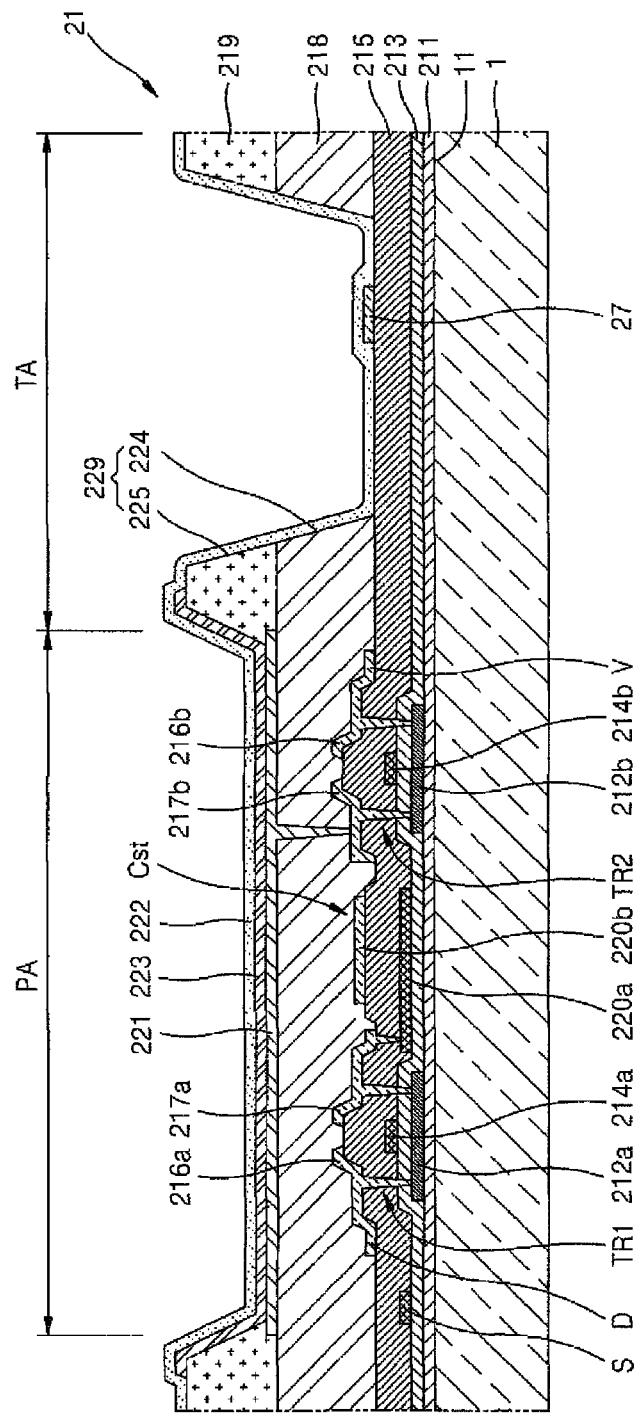
FIG. 9 is a cross-sectional view of the organic emission unit in detail according to another embodiment of the present invention.
Figure 10:
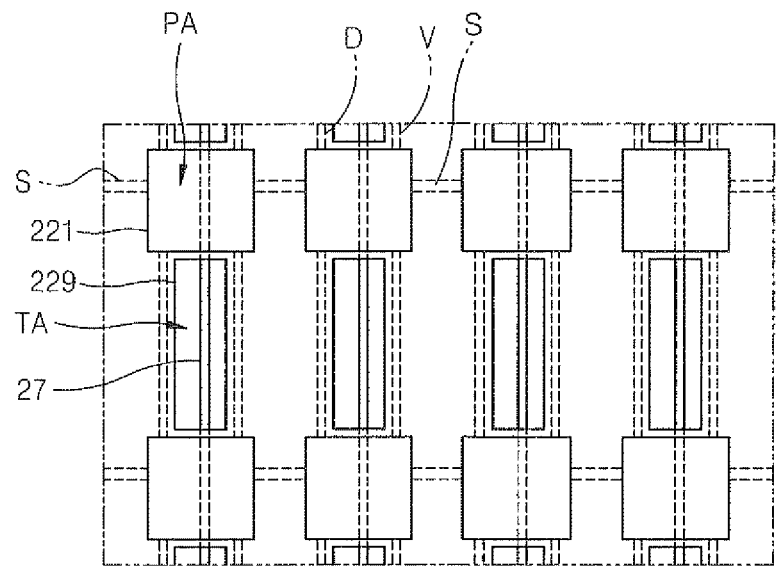
FIG. 10 is a plan view of patterns of a conduction unit according to an embodiment of the present invention.
Figure 11:
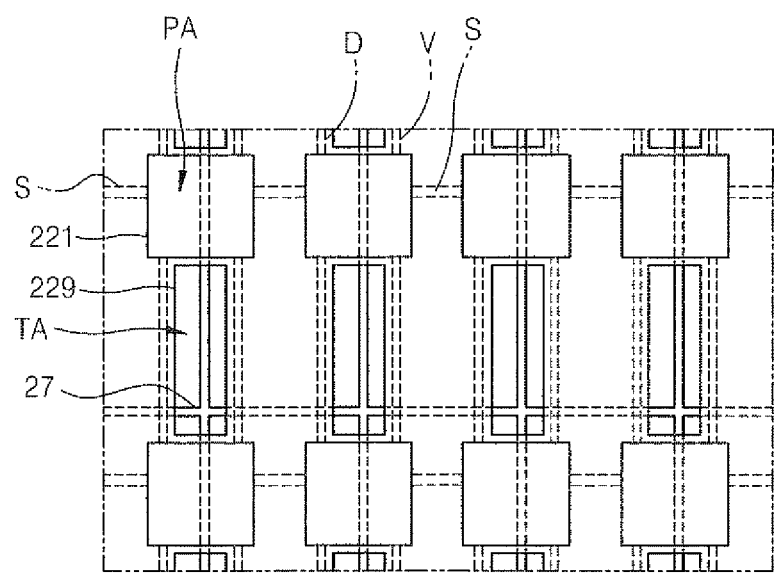
FIG. 11 is a plan view of patterns of the conduction unit according to another embodiment of the present invention.

FIG. 9 is a cross-sectional view of the organic emission unit in detail according to another embodiment of the present invention, FIG. 10 is a plan view of patterns of a conduction unit according to an embodiment of the present invention, and FIG. 11 is a plan view of patterns of the conduction unit according to another embodiment of the present invention.

Referring to FIG. 9, the conduction unit 27 may be formed of the same material as the material for forming the first source and first drain electrodes 216a and 217a, respectively, and the second source and second drain electrodes 216b and 217b, respectively, and may be simultaneously formed therewith. To this end, the conduction unit 27 may be formed on the interlayer insulating layer 215, and the opening 229 may be formed down to the passivation layer 218. However, aspects of the present invention are not limited thereto. The opening 229 may be formed in the shape of the opening 229 of FIG. 7.

When the conduction unit 27 is formed of the same material as the material for forming the first source and first drain electrodes 216a and 217a, respectively, and the second source and second drain electrodes 216b and 217b, respectively, and is simultaneously formed therewith, the conduction unit 27 may be formed in a straight line parallel to the data line D or the driving power line V, as illustrated in FIG. 10.

However, aspects of the present invention are not limited thereto. The conduction unit 27 may also be formed in a combination of straight lines parallel to the data line D and the scan line S.

Figure 12:
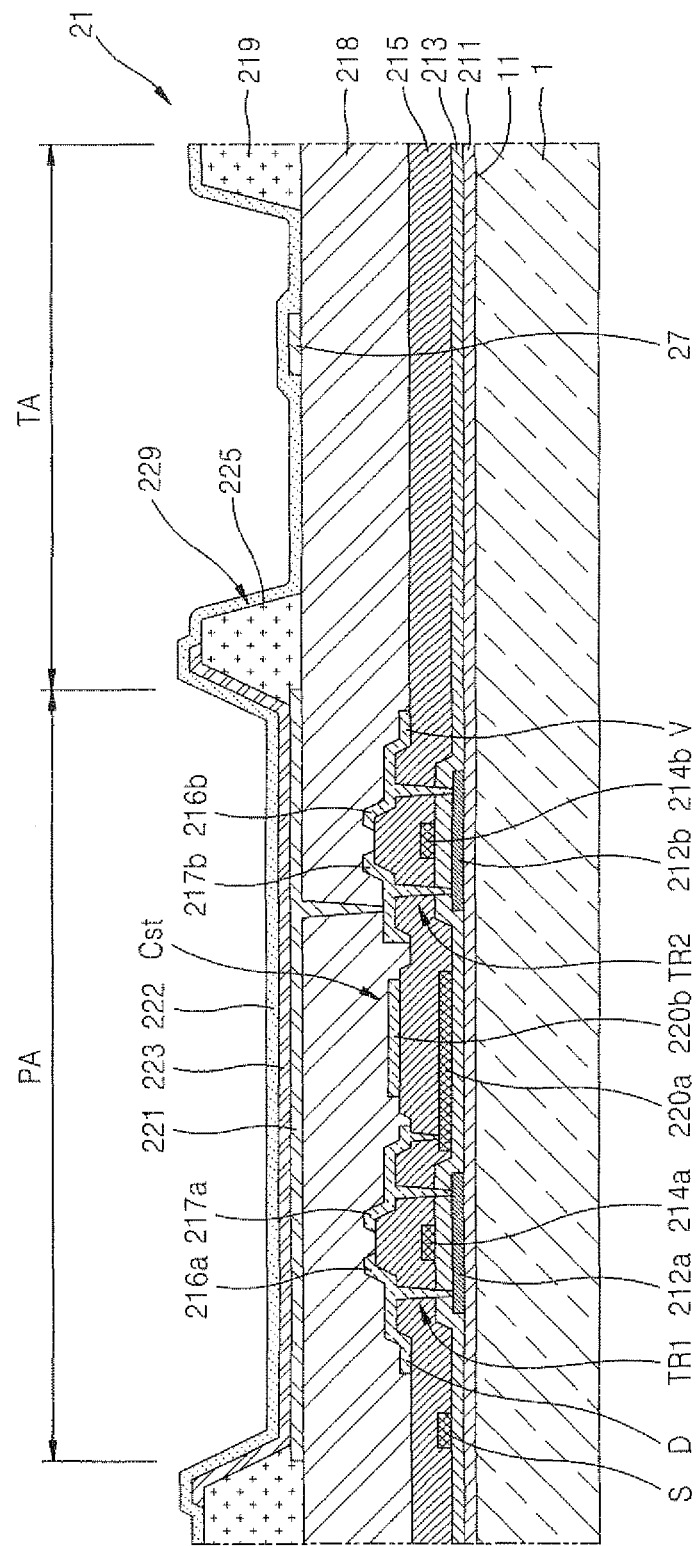
FIG. 12 is a cross-sectional view of the organic emission unit in detail according to another embodiment of the present invention.
Figure 13:
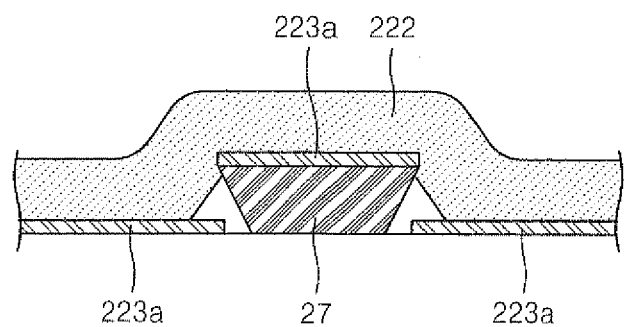
FIG. 13 is a cross-sectional view of the conduction unit according to an embodiment of the present invention.

FIG. 12 is a cross-sectional view of the organic emission unit in detail according to another embodiment of the present invention, and FIG. 13 is a cross-sectional view of the conduction unit according to an embodiment of the present invention.

Referring to FIG. 12, the conduction unit 27 may be formed of the same material as the material for forming the pixel electrode 221, and may be simultaneously formed therewith. To this end, the conduction unit 27 may be formed on the passivation layer 218, and the opening 229 may be formed down to the pixel defining layer 219. However, aspects of the present invention are not limited thereto. The opening 229 may also be formed in the shape of the opening 229 of FIG. 7.

In the above-described embodiments, the conduction unit 27 may be reversely tapered, as illustrated in FIG. 13. This is because the conduction unit 27 and the opposite electrode 222 do not contact each other due to a common layer 223a of the organic emission layer 223.

In detail, after the conduction unit 27 is formed so as to be reversely tapered, and the common layer 223a and the opposite electrode 222 are sequentially formed thereon in the order stated, as illustrated in FIG. 13, since the common layer 223a is cut in edge portions of the conduction unit 27, the conduction unit 27 and the opposite electrode 222 may contact each other.

Figure 14:
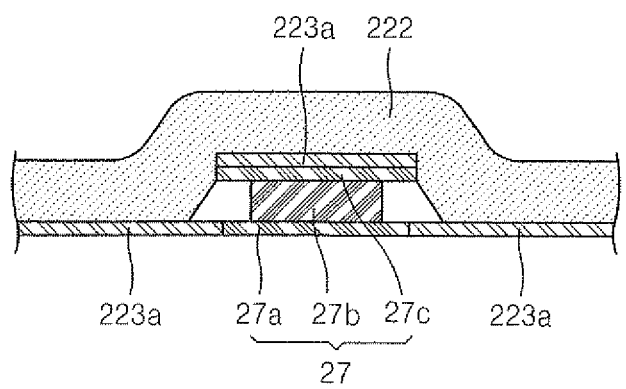
FIG. 14 is a cross-sectional view of the conduction unit according to another embodiment of the present invention.
Figure 15:
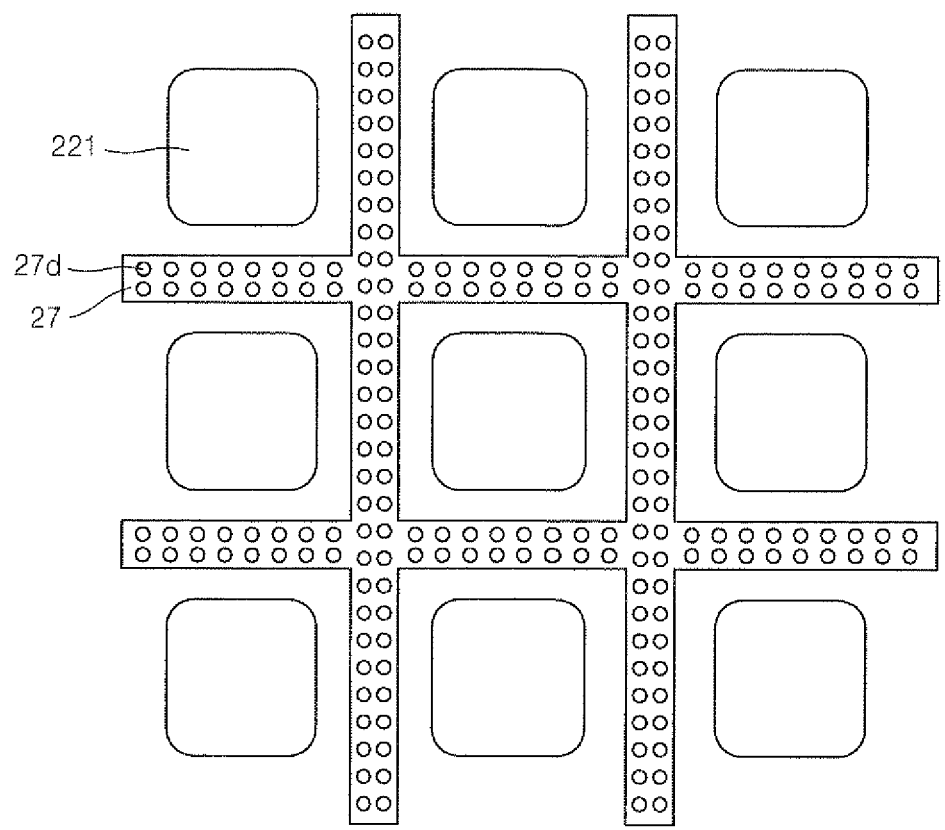
FIG. 15 is a plan view of patterns of the conduction unit according to another embodiment of the present invention.
Figure 16:
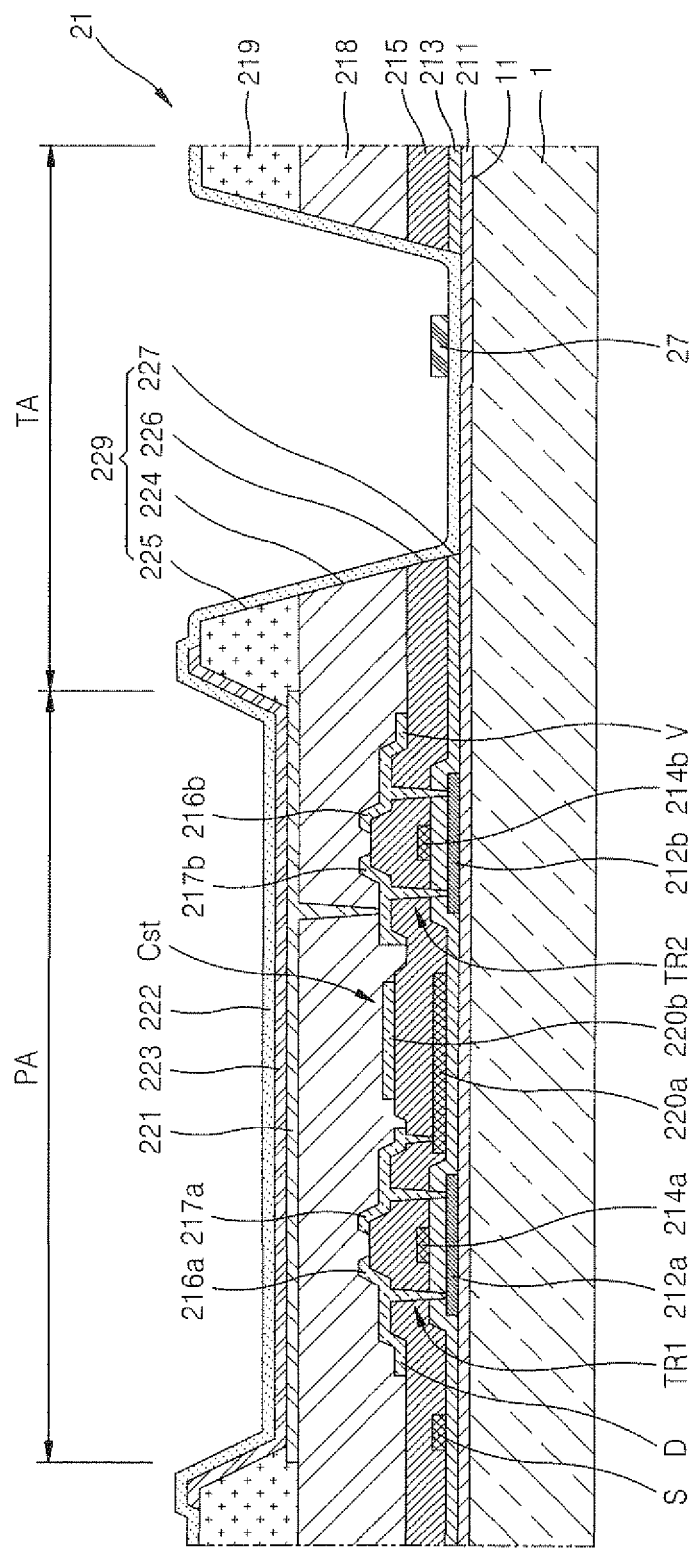
FIG. 16 is a cross-sectional view of the organic emission unit in detail according to another embodiment of the present invention.

FIG. 14 is a cross-sectional of the conduction unit having a reversely tapered structure according to another embodiment of the present invention, FIG. 15 is a plan view of patterns of the conduction unit according to another embodiment of the present invention, and FIG. 16 is a cross-sectional view of the organic emission unit in detail according to another embodiment of the present invention.

Referring to FIG. 14, when the conduction unit 27 is formed by stacking a plurality of metal materials, the conduction unit 27 may be formed in the shape illustrated in FIG. 14 by using an etching ratio of the metal materials. The conduction unit 27 of FIG. 14 has a structure in which a first conduction unit 27a, a second conduction unit 27b and a third conduction unit 27c are sequentially stacked from the bottom of the stack upward. In this regard, the second conduction unit 27b is formed in an inner position relative to the third conduction unit 27c.

The above-described effects of the conduction unit 27 of FIG. 13 may also be obtained in this structure of the conduction unit 27.

A plurality of holes 27d are formed in the conduction unit 27, as illustrated in FIG. 15, so as to reduce the probability that the common layer 223a formed of an organic material may be deposited on a side of the conduction unit 27, may be reduced, and may further increase the probability that the conduction unit 27 and the opposite electrode 222 contact each other.

In the above-described embodiments, the conduction unit 27 may be interposed between the opposite electrode 222 and the substrate 1. However, the conduction unit 27 may be formed on the opposite electrode 222, as illustrated in FIG. 16. Even in this case, the conduction unit 27 may be formed in a straight line parallel to the scan line S, the data line D or the driving power line V, or to a combination of straight lines parallel to the data line D and the scan line S.

Figure 17:
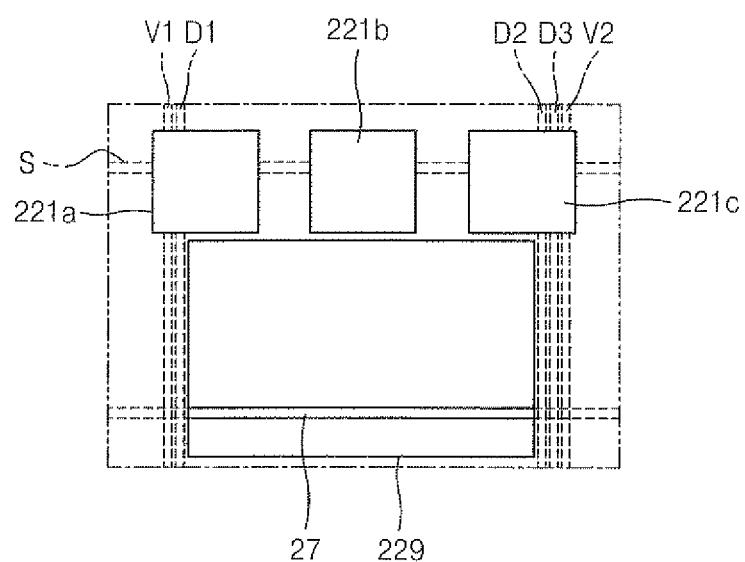
FIG. 17 is a plan view of the organic emission unit in detail according to another embodiment of the present invention.

FIG. 17 is a plan view of the organic emission unit in detail according to another embodiment of the present invention.

Referring to FIG. 17, one opening 229 is formed so as to correspond to a first pixel electrode 221a, a second pixel electrode 221b, and a third pixel electrode 221c. First thru third data lines D1, D2 and D3, respectively, are electrically connected to the first thru third pixel electrodes 221a, 221b, and 221c, respectively. A first driving power line V1 is electrically connected to the first pixel electrode 221a and the second pixel electrode 221b, and a second driving power line V2 is electrically connected to the third pixel electrode 221c.

In this structure, one large size opening 229 is formed in a plurality of sub-pixels. Thus, transmittance can be further increased, and image distortion due to light scattering can be further reduced. Furthermore, since the conduction unit 27 exposed through the large size opening 229 may contact the opposite electrode 222, a voltage drop in the opposite electrode 222 can be remarkably prevented.

As described above, the organic light-emitting display device according to the present invention can be transparent by improving a transmittance in transmitting regions, and can reduce a voltage drop in an opposite electrode by reducing a sheet resistance in the opposite electrode.

Also, distortion of an image which is transmitted therethrough can be prevented by preventing light transmitting therethrough from scattering.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display device, comprising:
    a transparent substrate; and
    a transparent display unit fixed adjacent to the transparent substrate, the transparent display unit comprising:
        a transmitting region and a plurality of pixel regions separated from each other by the transmitting region which is interposed between the pixel regions;
        a plurality of thin film transistors positioned on a first surface of the substrate and disposed in the pixel regions of the substrate, respectively;
        a passivation layer covering the plurality of thin film transistors, formed in the transmitting region and the pixel regions, and having a first opening formed in a location corresponding to at least a portion of the transmitting region;
        a plurality of pixel electrodes formed on the passivation layer and electrically connected to the thin film transistors, the pixel electrodes are disposed in the pixel regions, and which are disposed so as to overlap and cover the thin film transistors, respectively;
        an opposite electrode which faces the pixel electrodes, the opposite electrode being formed to be able to transmit light and being located in the transmitting region and the pixel regions;
        an organic emission layer interposed between the pixel electrodes and the opposite electrode to emit light; and
        a conduction unit comprising a conductive material disposed to overlap with the first opening, and contacting the opposite electrode,
        wherein a portion of the opposite electrode positioned at a bottom of the first opening completely covers non-bottom surfaces of the conduction unit interposed between and contacting the opposite electrode and an insulating layer.

2. The organic light-emitting display device of claim 1, each of the pixel electrodes having an area identical to an area of one of the pixel regions.

3. The organic light-emitting display device of claim 1, further comprising a plurality of conductive lines electrically connected to the thin film transistors, respectively, at least one of the conductive lines being arranged to overlap each of the pixel electrodes.

4. The organic light-emitting display device of claim 1, a ratio of a total area of the transmitting region with respect to a total area of the pixel regions and the transmitting region being between 5% and 90%.

5. The organic light-emitting display device of claim 1, the passivation layer comprising a transparent material.

6. The organic light-emitting display device of claim 1, a plurality of insulating layers being formed at a location corresponding to the transmitting region.

7. The organic light-emitting display device of claim 6, at least one of the insulating layers having a second opening connected to the first opening at a location corresponding to at least a portion of the transmitting region.

8. The organic light-emitting display device of claim 1, the pixel electrodes comprising reflective electrodes.

9. The organic light-emitting display device of claim 1, the conduction unit being reversely tapered.

10. The organic light-emitting display device of claim 1, the conduction unit having a plurality of holes.

11. The organic light-emitting display device of claim 1, the device allowing an image of an object located on a first side of the device to be observed by an observer located on a second side of the device, the second side being opposite to the first side.

12. The organic light-emitting display device of claim 1, the greater than 75% of the area of the transmitting region that is not occluded by the conduction unit being substantially free of light-occluding materials.

13. An organic light-emitting display device, comprising:
    a transparent substrate; and
    a transparent display unit fixed adjacent to the transparent substrate, the transparent display unit comprising:
        a transmitting region and a plurality of pixel regions separated from each other by the transmitting region which is interposed between the pixel regions;
        a plurality of thin film transistors positioned on a first surface of the substrate and disposed in the pixel regions of the substrate, respectively;
        a passivation layer covering the plurality of thin film transistors, formed in the transmitting region and the pixel regions, and having a first opening formed in a location corresponding to at least a portion of the transmitting region;
        a plurality of pixel electrodes formed on the passivation layer and electrically connected to the thin film transistors, the pixel electrodes are disposed in the pixel regions, and which are disposed so as to overlap and cover the thin film transistors, respectively;
        an opposite electrode which faces the pixel electrodes, the opposite electrode being formed to be able to transmit light and being located in the transmitting region and the pixel regions;
        an organic emission layer interposed between the pixel electrodes and the opposite electrode to emit light; and
        a conduction unit comprising a conductive material disposed to overlap with the first opening, and contacting the opposite electrode,
        wherein a portion of the opposite electrode is positioned at a bottom of the first opening, the conduction unit has an entire bottom surface contacting the portion of the opposite electrode, and the conduction unit is formed on the opposite electrode.

14. An organic light-emitting display device, comprising:
a substrate having a transmitting region and a plurality of pixel regions separated from each other by the transmitting region which is interposed between the pixel regions; and
a display unit placed adjacent to the substrate, the display unit comprising:
a plurality of pixel circuit units formed on a first surface of the substrate, each pixel circuit unit comprising at least one thin film transistor, the pixel circuit units being positioned in the pixel regions, respectively;
a first insulating layer covering the pixel circuit units, formed in the transmitting region and the pixel regions, and having a third opening formed in a location corresponding to at least a portion of the transmitting region;
a plurality of pixel electrodes which are formed on the first insulating layer so as to be electrically connected to the pixel circuit units, respectively, and which are disposed so as to overlap and cover the pixel circuit units, respectively;
an opposite electrode which faces the pixel electrodes, the opposite electrode being formed so as to be able to transmit light and being located in the transmitting region and the pixel regions;
an organic emission layer interposed between the pixel electrodes and the opposite electrode so as to emit light; and
a conduction unit comprising a conductive material disposed to overlap with the third opening and contacting the opposite electrode,
wherein a portion of the opposite electrode positioned at a bottom of the third opening completely covers non-bottom surfaces of the conduction unit interposed between and contacting the opposite electrode and an insulating layer.

15. The organic light-emitting display device of claim 14, the pixel electrodes being formed in the pixel regions, respectively.

16. The organic light-emitting display device of claim 14, further comprising a plurality of conductive lines electrically connected to the pixel circuit units, respectively, at least one of the conductive lines being arranged so as to cross each of the pixel regions.

17. The organic light-emitting display device of claim 14, a ratio of a total area of the transmitting region with respect to a total area of the pixel regions and the transmitting region being between 5% and 90%.

18. The organic light-emitting display device of claim 14, the first insulating layer comprising a transparent material.

19. The organic light-emitting display device of claim 14, a plurality of second insulating layers comprising a transparent material being further formed in the transmitting region and the pixel regions.

20. The organic light-emitting display device of claim 19, at least one of the second insulating layers having a fourth opening connected to the third opening and formed in a location corresponding to at least a portion of the transmitting region.

21. The organic light-emitting display device of claim 14, the pixel electrode being a reflective electrode.

22. The organic light-emitting display device of claim 14, the conduction unit being reversely tapered.

23. The organic light-emitting display device of claim 14, the conduction unit having a plurality of holes.

24. The organic light-emitting display device of claim 14, the device allowing an image of an object located on a first side of the device to be observed by an observer located on a second side of the device, the second side being opposite to the first side.

25. The organic light-emitting display device of claim 14, the greater than 75% of the area of the transmitting region that is not occluded by the conduction unit being substantially free of light-occluding materials.

26. An organic light-emitting display device, comprising:
a substrate having a transmitting region and a plurality of pixel regions separated from each other by the transmitting region which is interposed between the pixel regions; and
a display unit placed adjacent to the substrate, the display unit comprising:
a plurality of pixel circuit units formed on a first surface of the substrate, each pixel circuit unit comprising at least one thin film transistor, the pixel circuit units being positioned in the pixel regions, respectively;
a first insulating layer covering the pixel circuit units, formed in the transmitting region and the pixel regions, and having a third opening formed in a location corresponding to at least a portion of the transmitting region;
a plurality of pixel electrodes which are formed on the first insulating layer so as to be electrically connected to the pixel circuit units, respectively, and which are disposed so as to overlap and cover the pixel circuit units, respectively;
an opposite electrode which faces the pixel electrodes, the opposite electrode being formed so as to be able to transmit light and being located in the transmitting region and the pixel regions;
an organic emission layer interposed between the pixel electrodes and the opposite electrode so as to emit light; and
a conduction unit comprising a conductive material disposed to overlap with the third opening and contacting the opposite electrode,
wherein a portion of the opposite electrode is positioned at a bottom of the third opening, the conduction unit has an entire bottom surface contacting the portion of the opposite electrode, and the conduction unit is formed on the opposite electrode.

* * * * *